United States Patent
Zhang

(10) Patent No.: US 11,146,248 B1
(45) Date of Patent: Oct. 12, 2021

(54) HIGH LINEARITY RF CIRCUIT AND METHOD FOR IMPROVING LINEARITY THEREOF

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 16/876,628

(22) Filed: May 18, 2020

(51) Int. Cl.
    *H03H 11/18* (2006.01)
(52) U.S. Cl.
    CPC .................................. *H03H 11/18* (2013.01)
(58) Field of Classification Search
    CPC ........ H03H 11/18; H03H 11/02; H03H 11/16; H03H 11/20; H03H 7/20; H03H 7/19; H03K 17/74; H03K 17/6871; H03K 17/693; H03K 17/162
    See application file for complete search history.

(56) References Cited

U.S. PATENT DOCUMENTS

| | | | | |
|---|---|---|---|---|
| 3,684,977 A * | 8/1972 | Viles | ........................ | H03B 23/00 331/183 |
| 10,193,519 B2 | 1/2019 | Zhang | | |
| 2007/0120619 A1 * | 5/2007 | Kearns | ........................ | H01P 1/15 333/103 |
| 2016/0006241 A1 * | 1/2016 | Fitzgerald | ................ | H02H 9/04 361/13 |
| 2016/0336744 A1 * | 11/2016 | Parthasarathy | ........ | H02H 9/046 |
| 2017/0040996 A1 * | 2/2017 | Zhao | ..................... | H03K 17/693 |

FOREIGN PATENT DOCUMENTS

GB 2276786 * 10/1994 ............... H03H 7/01

* cited by examiner

*Primary Examiner* — John W Poos
(74) *Attorney, Agent, or Firm* — North Weber & Baugh LLP; Michael V. North

(57) ABSTRACT

Various embodiments of the invention relate to high linearity RF circuits that may operate or function consistently under various levels of voltage, current or power. Embodiments of a diode module comprising cascaded diodes and connecting bias branches are disclosed for improved linearity of RF circuits. The diode module may comprise multiple diodes reversely coupled in series. Additionally, the diode module further comprises connecting bias branches coupled in parallel with diode pairs. Such configuration of reversely cascaded diodes coupled with alternatively connecting bias branches increases the robustness of the diode module to handle high input voltage or power from the RF path, thus provides enhanced linearity for the RF circuit as compared to single diode configuration.

20 Claims, 5 Drawing Sheets

HIGH LINEARITY RF CIRCUIT AND METHOD FOR IMPROVING LINEARITY THEREOF

CROSS-REFERENCE TO RELATED APPLICATIONS

This application claims foreign priority to Chinese Patent Application No. 202010277867.7, entitled "HIGH LINEARITY RF CIRCUIT AND METHOD FOR IMPROVING LINEARITY THEREOF", naming Cemin Zhang as inventor, and filed Apr. 10, 2020, the subject matter of which is hereby incorporated herein by reference.

BACKGROUND

A. Technical Field

The present invention relates generally to RF circuits, and more particularly to RF circuits with high linearity.

B. Background of the Invention

A radio frequency (RF) circuit is an interconnection of electrical components (e.g., resistors, inductors, capacitors, switches, transistors, voltage sources, current sources, etc.) used to transmit, receive or process radio signals. A phase shifter is a microwave network module which provides a controllable phase shift of the radio frequency (RF) signal. RF circuits have been used widely in various applications, such as satellite communications, automotive radar, 5G cellular communications, imaging and sensing, etc. It is desirable that a RF circuit has a high linearity such that the RF circuit may operate or function consistently under various levels of voltage, current or power in the RF circuit.

Many RF circuits, e.g. RF phase shifters, filters, voltage controlled oscillators, mixers, or frequency multiplier, etc., use varactors as voltage-controlled capacitors. The varactor is a type of diode with a reverse-biased p-n junction displaying voltage-dependent capacitance. When handling higher input power, larger voltage swing may change the diode DC biasing point which limits the linearity of the varactors.

Accordingly, there is a need for high linearity RF circuits that may operate or function consistently under various levels of voltage, current or power.

SUMMARY OF THE INVENTION

The invention relates to high linearity RF circuits that may operate or function consistently under various levels of voltage, current or power.

In one or more embodiments, a diode module comprising cascaded diodes and connecting bias branches is disclosed. The diode module may comprise multiple diodes reversely coupled in series. In one or more embodiments, a first diode has its cathode connected to a RF path (RF); a second diode has its anode connected to the anode of the first diode at a first node; a third diode has its cathode connected to the cathode of the second diode at a second node and its anode grounded. Additionally, the diode module may further comprise a first connecting bias branch coupled between the RF path and the second node, and a second connecting bias branch coupled between the first node and ground. The connecting bias branches may comprise a resistor, a choke inductor, or a combination of both. The resistance value of the resistor in the connecting bias branches is set to be small enough to ensure an equal or approximately equal DC potential between nodes for each connecting bias branch, and also large enough to provide a desired RF isolation between the nodes. In one or more embodiments, a choke inductor may be added in series to the resistor to further improve RF isolation between the nodes. Such a configuration of reversely cascaded diodes coupled with alternatively connecting bias branches increases the robustness of the diode module to handle high input voltage or power from the RF path, thus provides enhanced linearity for the RF circuit as compared to single diode configuration.

In one or more embodiments, a diode module may further comprise a series capacitor besides cascaded diodes and connecting bias branches. The series capacitor couples in series to a pair of reversely cascaded diode, and provides further DC blocking between the RF path and ground.

In one or more embodiments, a diode module comprising cascaded diodes, connecting bias branches, a series capacitor, and a bias voltage source is disclosed. The diode module comprises a first diode and a second diode reversely coupled in series. The first diode has its anode connected to a RF path (RF) via a series capacitor at a first node and its cathode connected to a cathode of a second diode at a second node. The second diode has its anode grounded. Additionally, the diode module further comprises a first connecting bias branch coupled between a DC voltage source VDC and the second node, and a second connecting bias branch coupled between the first node and ground. The series capacitor in the diode module provides further DC blocking between the RF path and ground. In one or more embodiments, the DC voltage source VDC may be adjustable to provide a desirable bias voltage to the diode module.

Embodiments of the diode modules may be used in various RF circuits, including but not limited to RF phase shifters, RF filters, voltage-controlled oscillators, mixers, amplifiers, frequency multipliers, etc. Simulation results show that RF phase shifters incorporated with cascaded diode modules have significantly improved linearity performance as shown in IP3 and IMD3 parameters, thus verifies the effectiveness of the reversely cascaded configurations.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

Components, or modules, shown in diagrams are illustrative of exemplary embodiments of the invention and are meant to avoid obscuring the present disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

Figure 1:
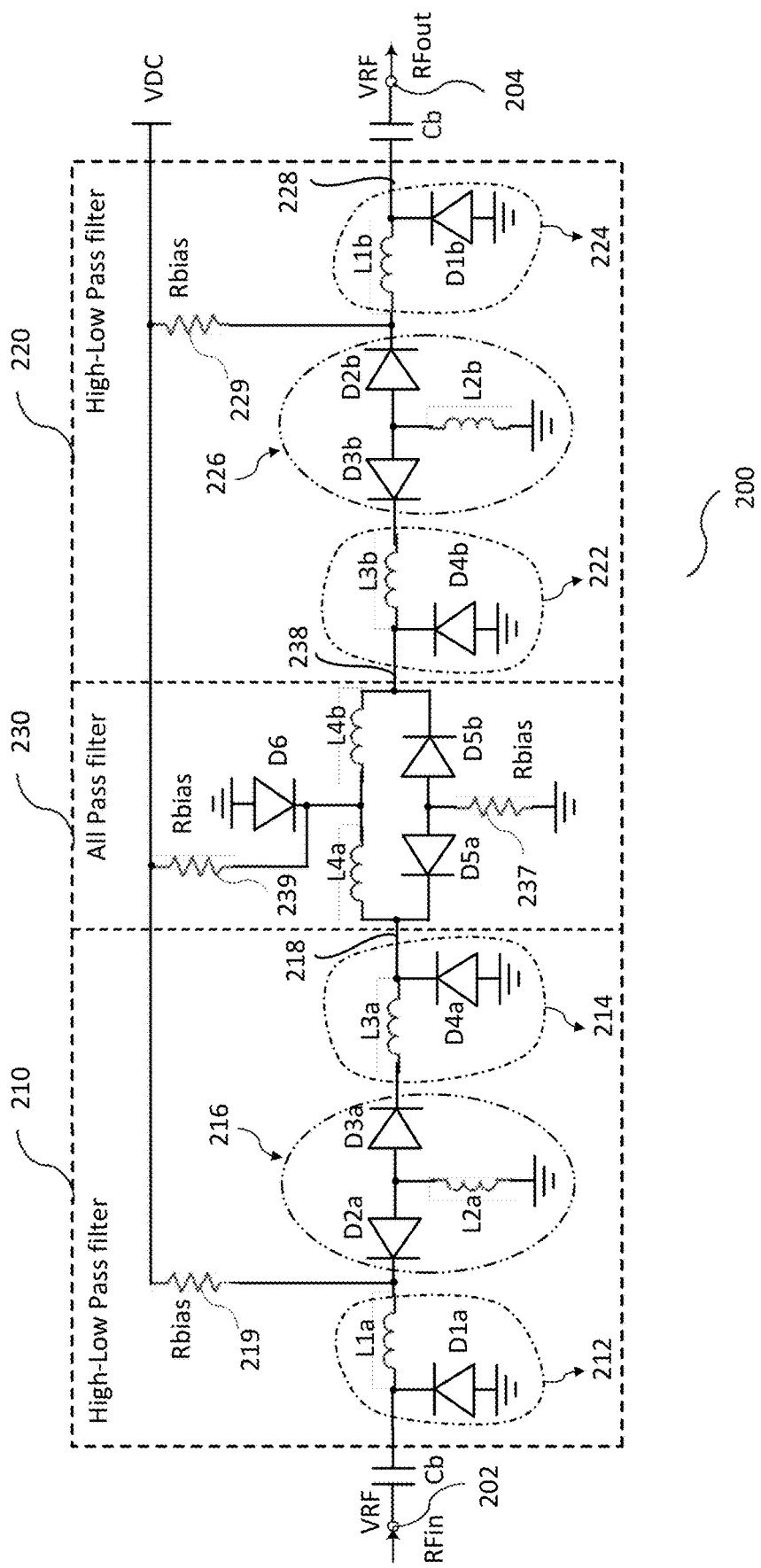
FIG. 1 depicts a prior art analog RF phase shifter.

FIG. 1 is a prior art analog phase shifter 200 disclosed in U.S. Pat. No. 10,193,519 B2. As shown in FIG. 1, the analog phase shifter 200 comprises a first high-low pass (HLP) filter 210, a second HLP filter 220, and an all-pass filter (APF) 230 coupled in series between the first high-low pass filter 210 and the second HLP filter 220 to assist phase shift tuning. The first HLP filter 210 receives an input RF signal $RF_{in}$ from an input terminal 202 and outputs a first HLP output signal 218. The APF 230 receives the first HLP output signal 218 and outputs an APF output signal 238. The second HLP filter 220 receives APF output signal 238 and outputs an output RF signal $RF_{out}$ via an output terminal 204. The HLP filters 210 and 220 may each incorporate multiple sections (212, 214, 216, 222, 224, and 226) for desired functions. The output RF signal $RF_{out}$ has a controllable and adjustable relative phase shift over the input RF signal $RF_{in}$.

However, as shown in FIG. 1, the D1, D4 in LP section, D6 in All Pass Filter has only one diode. When handling higher input power, larger voltage swing would change the diode DC biasing point, which may limit the linearity of phase shifter, and thus cause undesirable IP3 (third-order intercept point, a well-known parameter to gauge linearity in RF functions and components) and IMD3 (third-Order intermodulation distortion, a well-known parameter to gauge linearity in RF functions and components).

To overcome the above drawbacks, various technical schemes have been implemented in the present invention for improving linearity of RF circuits, e.g. RF phase shifters.

Embodiment 1

Figure 2:
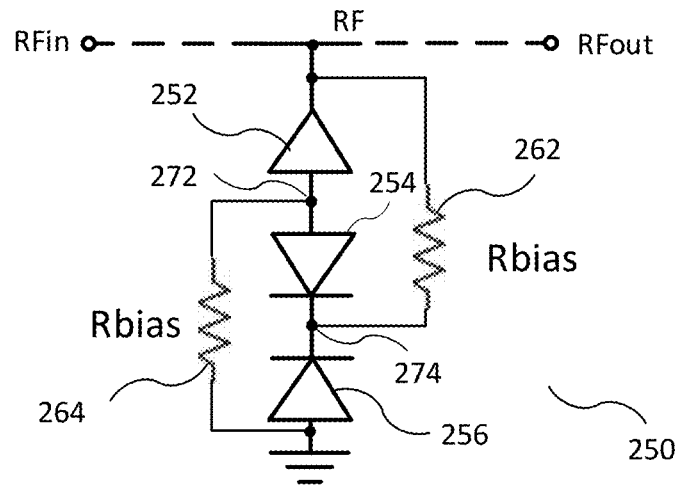
FIG. 2 depicts a schematic diagram of a diode module comprising cascaded diodes and connecting bias branches according to embodiment 1 of the invention.

FIG. 2 depicts a schematic diagram of a diode module 250 comprising cascaded diodes and connecting bias branches according to embodiment 1 of the invention. The diode module 250 comprises a first diode 252, a second diode 254, and a third diode 256, which are reversely coupled in series. Specifically, the first diode 252 has its cathode connected to a RF path (RF) between an RF input port (RFin) and an RF output port (RFout); the second diode 254 has its anode connected to the anode of the first diode 252 at a first node 272; the third diode 256 has its cathode connected to the cathode of the second diode 254 at a second node 274 and its anode grounded. Additionally, the diode module 250 further comprises a first connecting bias branch 262 coupled between the RF path and the second node 274, and a second connecting bias branch 264 coupled between the first node 272 and ground. In this embodiment, the first connecting bias branch 262 and the second connecting bias branch 264 are simply connecting resistors. Such configuration of reversely cascaded diodes coupled with alternatively connecting resistors increases the robustness of the diode module 250 to handle high input voltage or power from the RF path, thus provides enhanced linearity for the RF circuit as compared to single diode configuration.

In one or more embodiments, the diode module 250 (also applicable to other diode modules in the present patent disclosure) may be used to replace the shunt diodes (e.g. D1a, D1b, D4a and D4b) shown in FIG. 1 to improve overall linearity of the RF circuit. The RF path shown in FIG. 2 may be referred as the RF signal processing or transmission path between the RFin port 202 and the RFout port 204, as shown in FIG. 1.

In one or more embodiments, the first diode 252, the second diode 254, and the third diode 256 may have the same specification (e.g. size, current limit, etc.) and may be varactors. DC biasing may be added (via the first node 272 and the second node 274) to provide DC biasing for each diode. Diode size may be configured to increase accordingly with increase of diode section, i.e., diode size of a three-section structure would be approximately three times the diode size in a single section structure. Additionally, the resistance value of the first connecting bias branch 262 and the second connecting bias branch 264 are chosen to be small enough to provide a same DC potential between nodes it connected, and large enough to provide good RF isolation between nodes. In one or more embodiments, the first connecting bias branch 262 and the second connecting bias branch 264 may have the same resistance value, e.g. a value of around 3000 Ohm.

Embodiment 2

Figure 3:
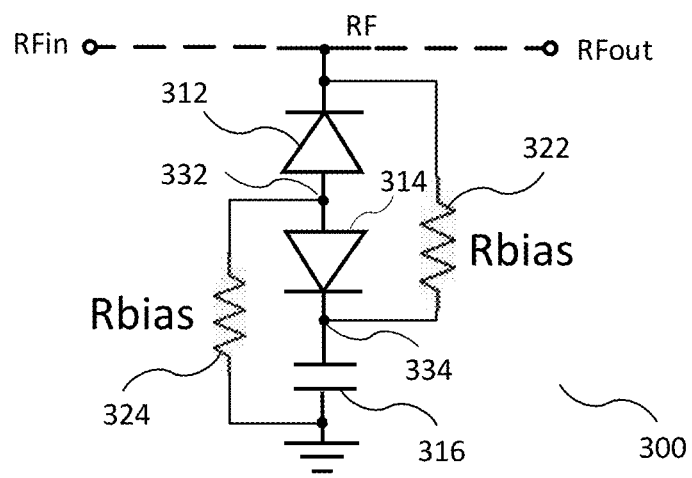
FIG. 3 depicts a schematic diagram of a diode module comprising cascaded diodes, connecting bias branches, and a series capacitor according to embodiment 2 of the invention.

FIG. 3 depicts a schematic diagram of a diode module 300 comprising cascaded diodes, connecting resistors, and a series capacitor according to embodiment 2 of the invention. The diode module 300 comprises a first diode 312 and a second diode 314, which are reversely coupled in series. Specifically, the first diode 312 has its cathode connected to a RF path (RF) and its anode connected to an anode of the second diode 314 at a first node 332. A series capacitor 316 couples between the cathode of the second diode 314 at a second node 334 and ground. Additionally, the diode module 300 further comprise a first connecting resistor 322 coupled between the RF path and the second node 334, and a second connecting resistor 324 coupled between the first node 332 and ground. Compared to the diode module 250 in the embodiment 1, the diode module 300 incorporates the series capacitor 316 for further DC blocking between the RF path and ground.

Embodiment 3

Figure 4:
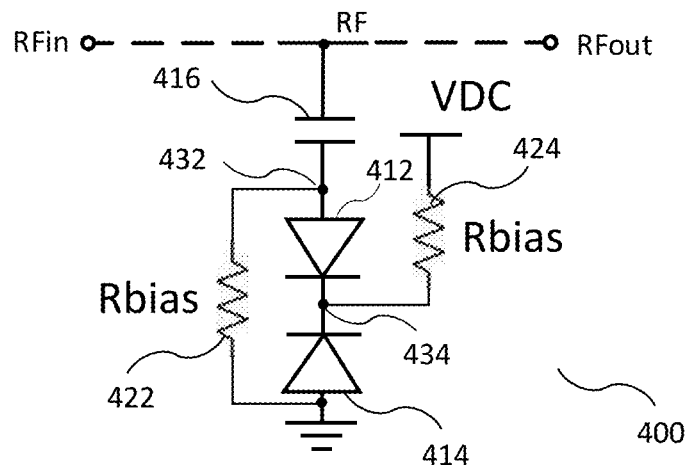
FIG. 4 depicts a schematic diagram of a diode module comprising cascaded diodes, connecting bias branches, a series capacitor, and a bias voltage source according to embodiment 3 of the invention.

FIG. 4 depicts a schematic diagram of a diode module 400 comprising cascaded diodes, connecting resistors, a series capacitor, and a bias voltage source according to embodiment 3 of the invention. The diode module 400 comprises two diodes 412 and 414, which are reversely coupled in series. Specifically, a first diode 412 has its anode connected to a RF path (RF) via a series capacitor 416 at a first node 432 and its cathode connected to a cathode of a second diode 414 at a second node 434. The second diode 414 has its anode grounded. Additionally, the diode module 400 further comprises a first connecting resistor 422 coupled between the first node 432 and ground, and a second connecting resistor 424 coupled between a DC voltage source VDC and the second node 434, and, similar to the series capacitor 316 in the diode module 300 of the embodiment 2, the series capacitor 416 in the diode module 400 also provides further DC blocking between the RF path and ground. In one or more embodiments, the DC voltage source VDC may be adjustable to provide a desirable bias voltage to the diode module 400.

Figure 5:
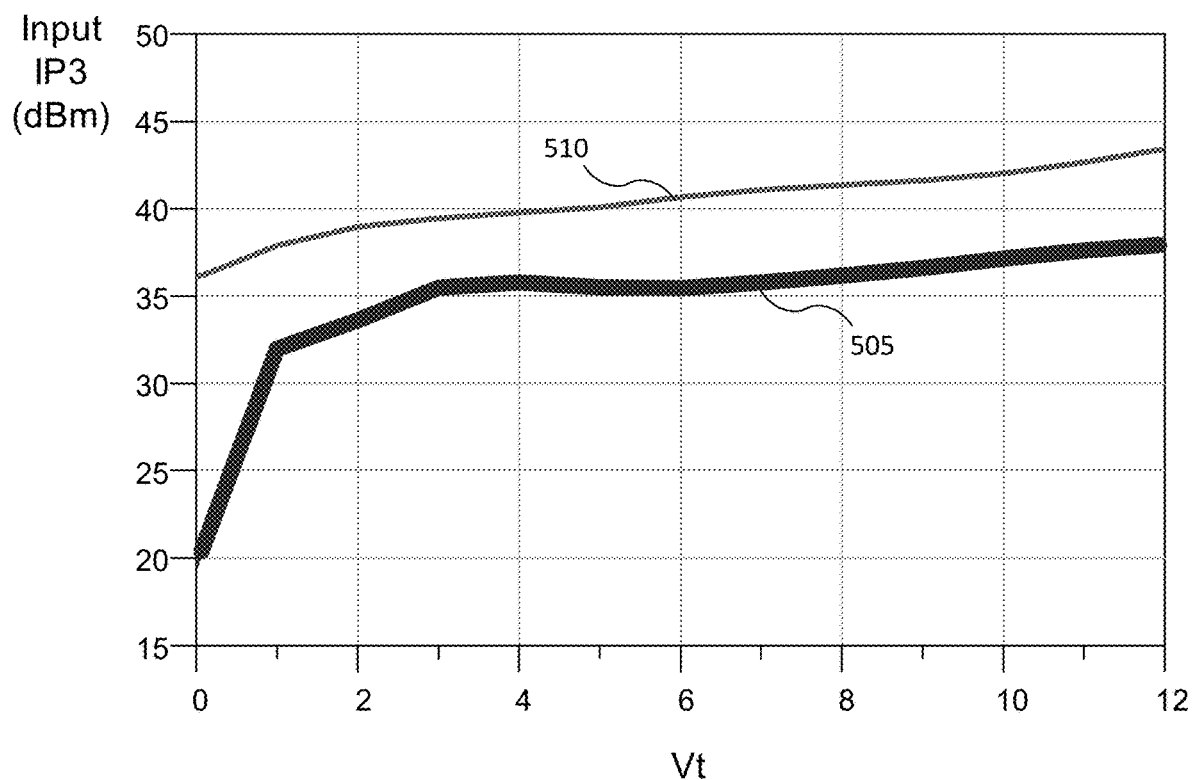
FIG. 5 depicts a simulation comparison of input IP3 between the prior art RF phase shifter and an embodiment of the present invention.

FIG. 5 depicts a simulation comparison of input IP3 between the prior art RF phase shifter (as shown in FIG. 1) and an improved RF phase shifter incorporated with reversely cascaded diode modules, according to one or more embodiment of the present invention. As well known for one skilled in the art, IP3 is the point where first-order line and third-order line cross, and one of the fundamental measurements for RF circuit linearity. It is highly desirable for a RF circuit to have a high IP3 for high linearity performance. As shown in FIG. 5, line 505 relates a simulated IP3 of a prior art RF phase shifter shown in FIG. 1, and line 510 relates to an embodiment of an RF phase shifter incorporating reversely cascaded diodes configuration. It is clearly shown that with the incorporation of reversely cascaded diodes, an RF phase shifter may has an IP3 improved at least 5 dB, thus improves linearity of the phase shifter significantly.

Figure 6:
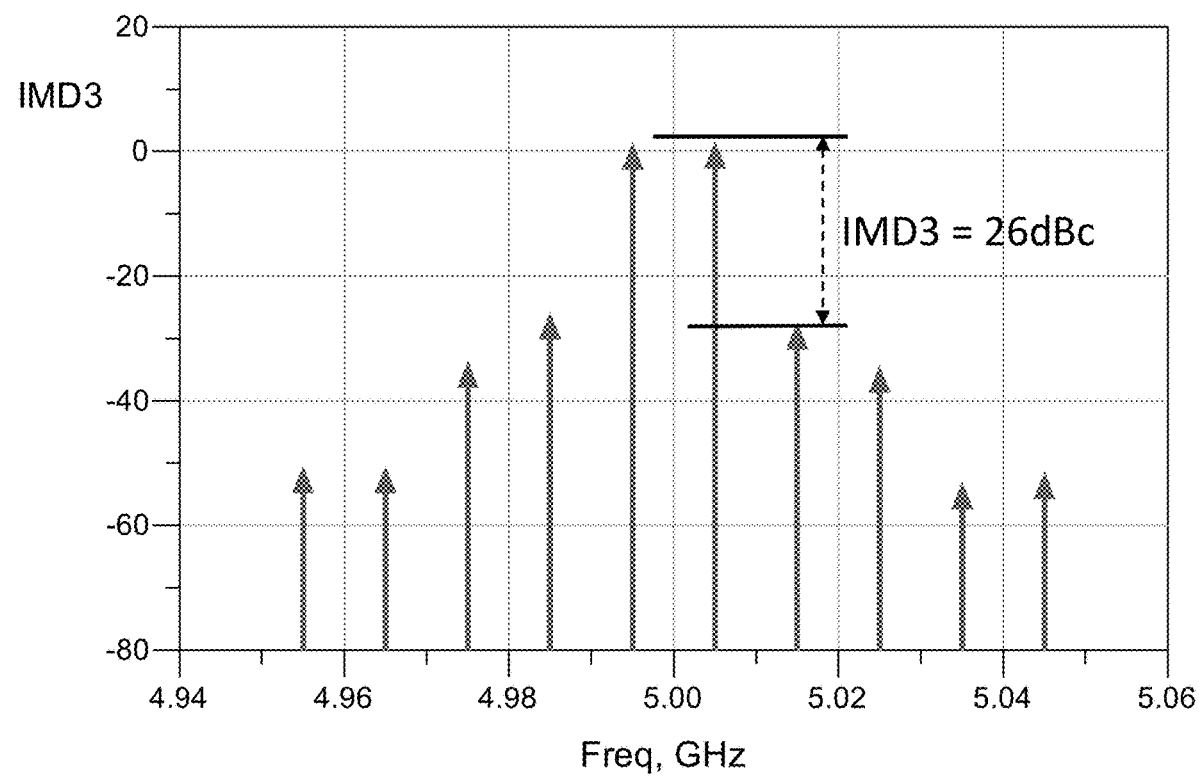
FIG. 6 depicts an IMD3 of the prior art RF phase shifter.
Figure 7:
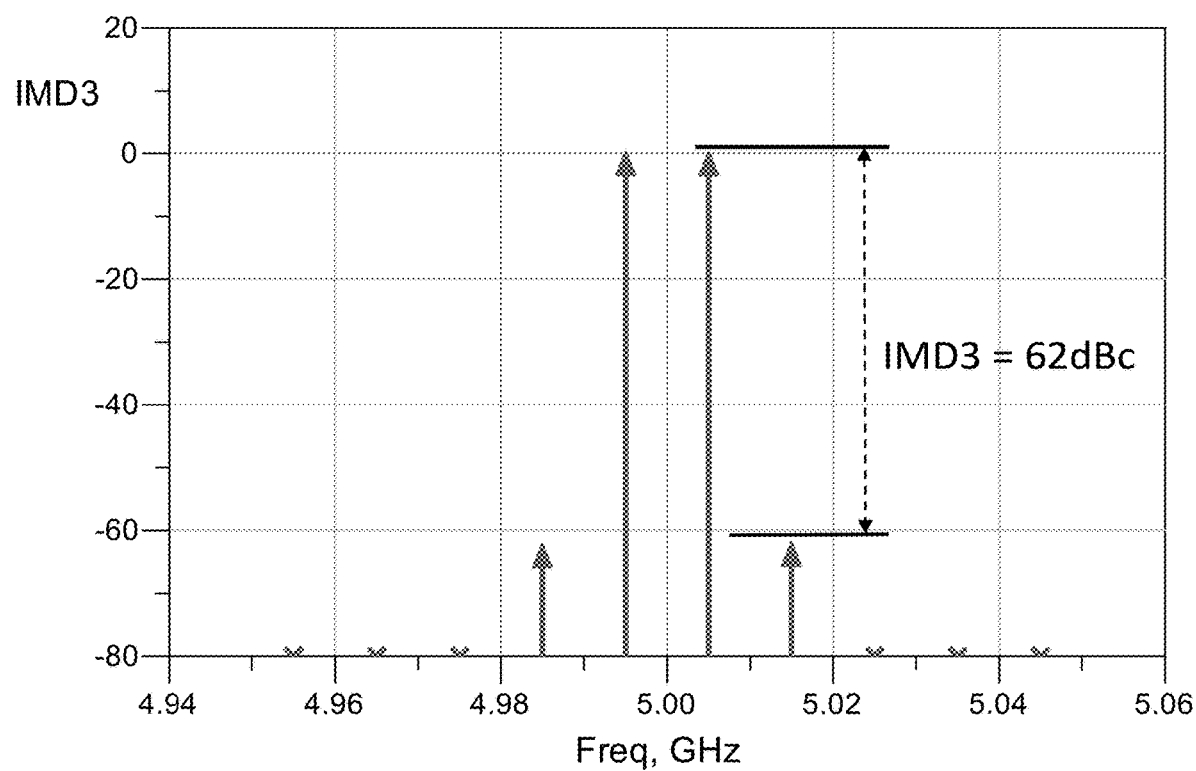
FIG. 7 depicts an IMD3 of an improved RF phase shifter according to one or more embodiment of the invention.

FIG. 6 and FIG. 7 respectively depicts an IMD3 of a prior art RF phase shifter and an IMD3 of an improved RF phase shifter according to one or more embodiment of the invention. IMD3 refers to the intermodulation distortion from the third order of an RF circuit, which is the result of nonlinear behavior of the RF circuit. It is of particular importance for wide band RF circuits because the distortion may be often within the signal band. The prior art RF phase shifter (shown in FIG. 1) has an IMD3 of 26 dBc (decibels relative to carrier) as shown in FIG. 6, while an embodiment of the improved RF phase shifters has an IMD3 of 62 dBc as shown in FIG. 7, which is a significant improvement from the prior art.

The foregoing description of the invention has been described for purposes of clarity and understanding. It is not intended to limit the invention to the precise form disclosed. Various modifications may be possible within the scope and equivalence of the appended claims. Although embodiments of the present invention are used in RF phase shifters for linearity improvement, one skilled in the art shall understand that the configurations of using cascaded diodes in reverse series connection coupled with connecting bias branches and/or capacitors may also be used in various other RF circuits, including but not limited to voltage-controlled oscillators, amplifiers, filters, mixers, frequency multipliers, etc.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims may be arranged differently including having multiple dependencies, configurations, and combinations. For example, in embodiments, the subject matter of various claims may be combined with other claims.

The invention claimed is:

1. A radio-frequency (RF) circuit comprising:
   an RF path coupled between an RF input port and an RF output port; and
   a diode module coupled in shunt to the RF path for circuit linearity improvement, the diode module comprising:
   a first diode coupled to the RF path;
   a second diode coupled in series to the first diode at a first node, the second diode and the first diode are reversely cascaded;
   a third diode or a capacitor coupled in series between the second diode at a second node and ground;
   a first connecting bias branch coupled between the RF path and the second node such that the first connecting bias branch is in parallel to the first diode and the second diode; and
   a second connecting bias branch coupled between the first node and ground such that the second connecting bias branch is in parallel to the second diode and the third diode or the capacitor.

2. The RF circuit of claim 1 wherein the first diode has a cathode coupled to the RF path and an anode coupled to the second diode, the second diode has an anode coupled to the first diode and a cathode coupled to the third diode or the capacitor.

3. The RF circuit of claim 1 wherein the third diode has a cathode coupled to the second diode.

4. The RF circuit of claim 1, wherein the first diode, the second diode and the third diode each receive DC biasing inputs for bias control.

5. The RF circuit of claim 1 wherein the first and the second connecting bias branches each comprises a resistor.

6. The RF circuit of claim 1 wherein the first diode, the second diode and the third diode have the same specification.

7. The RF circuit of claim 1 wherein the first diode, the second diode and the third diode are varactors.

8. A radio-frequency (RF) circuit comprising:
  an RF path coupled between an RF input port and an RF output port; and
  a diode module coupled in shunt to the RF path for circuit linearity improvement, the diode module comprising:
    a capacitor coupled to the RF path;
    a first diode coupled in series to the capacitor at a first node;
    a second diode having one end coupled in series to the first diode at a second node and another end grounded, the second diode and the first diode are reversely cascaded; and
    a first connecting bias branch coupled between the first node and ground such that the first connecting bias branch is in parallel to the first diode and the second diode.

9. The RF circuit of claim 8 further comprises a second connecting bias branch coupled between a DC voltage source VDC and the second node.

10. The RF circuit of claim 9 wherein the first and the second connecting bias branches each comprises a resistor.

11. The RF circuit of claim 8, wherein the first diode has an anode coupled to the capacitor and a cathode coupled to the second diode, the second diode has a cathode coupled to the first diode and an anode coupled to ground.

12. The RF circuit of claim 8 wherein the first diode and the second diode have the same specification.

13. The RF circuit of claim 8 wherein the first diode and the second diode are varactors.

14. A method for improving linearity of a radio-frequency (RF) circuit comprising:
  given an RF path coupled between an RF input port and an RF output port:
    coupling a first diode in shunt to the RF path;
    reversely cascading a second diode to the first diode at a first node;
    coupling a third diode or a capacitor in series between the second diode at a second node and ground;
    coupling a first connecting bias branch between the RF path and the second node such that the first connecting bias branch is in parallel to the first diode and the second diode; and
    coupling a second connecting bias branch between the first node and ground such that the second connecting bias branch is in parallel to the second diode and the third diode or the capacitor.

15. The method of claim 14 wherein the first diode has a cathode coupled to the RF path and an anode coupled to the second diode, the second diode has an anode coupled to the first diode and a cathode coupled to the third diode or the capacitor.

16. The method of claim 14, wherein the first diode, the second diode and the third diode each receive DC biasing inputs for bias control.

17. The method of claim 14 wherein the third diode has a cathode coupled to the second diode.

18. The method of claim 14 wherein the first and the second connecting bias branches each comprises a resistor.

19. The method of claim 14 wherein the first diode, the second diode and the third diode have the same specification.

20. The method of claim 14 wherein the first diode, the second diode and the third diode are varactors.

* * * * *